United States Patent
Shiota

(10) Patent No.: US 9,576,513 B2
(45) Date of Patent: Feb. 21, 2017

(54) METHOD FOR MANUFACTURING EL DISPLAY APPARATUS

(71) Applicant: PANASONIC CORPORATION, Osaka (JP)

(72) Inventor: Akinori Shiota, Osaka (JP)

(73) Assignee: JOLED INC, Tokyo (JP)

( * ) Notice: Subject to any disclaimer, the term of this patent is extended or adjusted under 35 U.S.C. 154(b) by 332 days.

(21) Appl. No.: 14/283,956

(22) Filed: May 21, 2014

(65) Prior Publication Data

US 2014/0253133 A1  Sep. 11, 2014

Related U.S. Application Data

(63) Continuation of application No. PCT/JP2012/007521, filed on Nov. 22, 2012.

(30) Foreign Application Priority Data

Feb. 9, 2012  (JP) .................. 2012-025761

(51) Int. Cl.
G09F 9/00 (2006.01)
G09G 3/00 (2006.01)
(Continued)

(52) U.S. Cl.
CPC ........... *G09G 3/006* (2013.01); *H01L 27/3211* (2013.01); *H01L 51/56* (2013.01); *G09G 3/3225* (2013.01); *H01L 2251/562* (2013.01)

(58) Field of Classification Search
CPC ... G09G 3/006; G09G 3/3225; H01L 27/3211; H01L 51/56; H01L 2251/562; H01L 22/22; H01L 22/14; H01L 33/0095
See application file for complete search history.

(56) References Cited

U.S. PATENT DOCUMENTS

2002/0142697 A1* 10/2002 Yamagata ............... H01L 51/52
445/24
2005/0196892 A1   9/2005 Yamagata et al.
(Continued)

FOREIGN PATENT DOCUMENTS

JP   2002-260857 A   9/2002
JP   2006-100099 A   4/2006
(Continued)

OTHER PUBLICATIONS

International Search Report issued in PCT/JP2012/007521, dated Feb. 26, 2013, with English translation.

*Primary Examiner* — David Gray
*Assistant Examiner* — Michael Harrison
(74) *Attorney, Agent, or Firm* — McDermott Will & Emery LLP

(57) ABSTRACT

The present disclosure relates to a method for manufacturing an EL display apparatus including a light-emitting portion in which a light emitting layer is disposed between a pair of electrodes, a thin film transistor array device for controlling light emission of the light-emitting portion, and an EL display panel in which a plurality of pixels of colors of R, G, and B are disposed. After production of the EL display panel, an inspection step is performed to apply, to each of the pixels, a voltage which is preset for each of the colors of R, G, and B of the pixels, the voltage applied in the inspection step is a potential difference that is a reverse bias voltage opposite to an anode voltage and a cathode voltage during lighting, and the potential difference allows a faulty pixel to turn to a dead dot.

1 Claim, 3 Drawing Sheets

(51) Int. Cl.
*H01L 51/56* (2006.01)
*H01L 27/32* (2006.01)
*G09G 3/32* (2016.01)

(56) References Cited

U.S. PATENT DOCUMENTS

2009/0325450 A1  12/2009  Suzuki et al.
2010/0233931 A1  9/2010   Yamagata et al.
2011/0136266 A1  6/2011   Yamagata et al.
2013/0137194 A1  5/2013   Yamagata et al.

FOREIGN PATENT DOCUMENTS

JP  2007-207703 A  8/2007
JP  2010-009964 A  1/2010
JP  2010-176966 A  8/2010

* cited by examiner

METHOD FOR MANUFACTURING EL DISPLAY APPARATUS

RELATED APPLICATIONS

This application is a continuation of International Application No. PCT/JP2012/007521, filed on Nov. 22, 2012, which in turn claims the benefit of Japanese Application No. 2012-025761, filed on Feb. 9, 2012, the disclosures of which Applications are incorporated by reference herein.

TECHNICAL FIELD

The present disclosure relates to a method for manufacturing an EL display apparatus including electroluminescent (hereinafter, referred to as "EL") elements which use organic materials as light-emitting materials and are arranged like a matrix.

BACKGROUND ART

An EL display apparatus including a plurality of EL elements that emit light and are arrayed does not require backlight, and places no limitations on a viewing angle, and therefore is under development as an image display apparatus of the next generation.

In the EL display apparatus, the EL element is a current-driven light-emitting element whose brightness is controlled by an amount of current passed there through. A passive matrix type and an active matrix type are provided as methods for driving the EL elements. Although the passive matrix method has simple pixel circuits, it is difficult to achieve a large-scaled and high-definition display. For this reason, in recent years, an EL display apparatus of an active matrix type provided with a drive transistor for each of the pixel circuits has formed a mainstream.

The drive transistor and a peripheral circuit thereof are formed generally of thin film transistors using poly silicon, amorphous silicon, or the like. The thin-film transistor is suitable for the large-scaled EL display apparatus because it is easy to fit for upsizing and inexpensive, although it has some drawbacks such as poor mobility and large changes in the threshold voltage with time. Further, there have been some studies also conducted for measures to overcome the changes in the threshold voltage with time, which is a drawback of the thin film transistor, by working on the pixel circuits.

When the EL display apparatus of this type is manufactured, the thin film transistor in the pixel may be broken or damaged by electrostatic discharge during the manufacturing process. Therefore, a panel inspection is performed during a manufacturing process as other display apparatuses need it (see Patent Literature 1).

CITATION LIST

Patent Literature

PTL 1: Unexamined Japanese Patent Publication No. 2010-176966

SUMMARY

The present disclosure relates to a method for manufacturing an EL display apparatus including a light-emitting portion in which a light emitting layer is disposed between a pair of electrodes, a thin film transistor array device for controlling light emission of the light-emitting portion, and an EL display panel in which a plurality of pixels of colors of R, G, and B are arranged. After production of the EL display panel, an inspection step is performed to apply, to each of the pixels, a voltage which is preset for each of the colors of R, G, and B of the pixels. The voltage applied in the inspection step is a potential difference that is a reverse bias voltage opposite to an anode voltage and a cathode voltage during lighting, and the potential difference allows a faulty pixel to turn to a dead dot.

DESCRIPTION OF EMBODIMENT

Hereinafter, a method for manufacturing an EL display apparatus according to one embodiment will be described with reference to the accompanying drawings.

Figure 1:
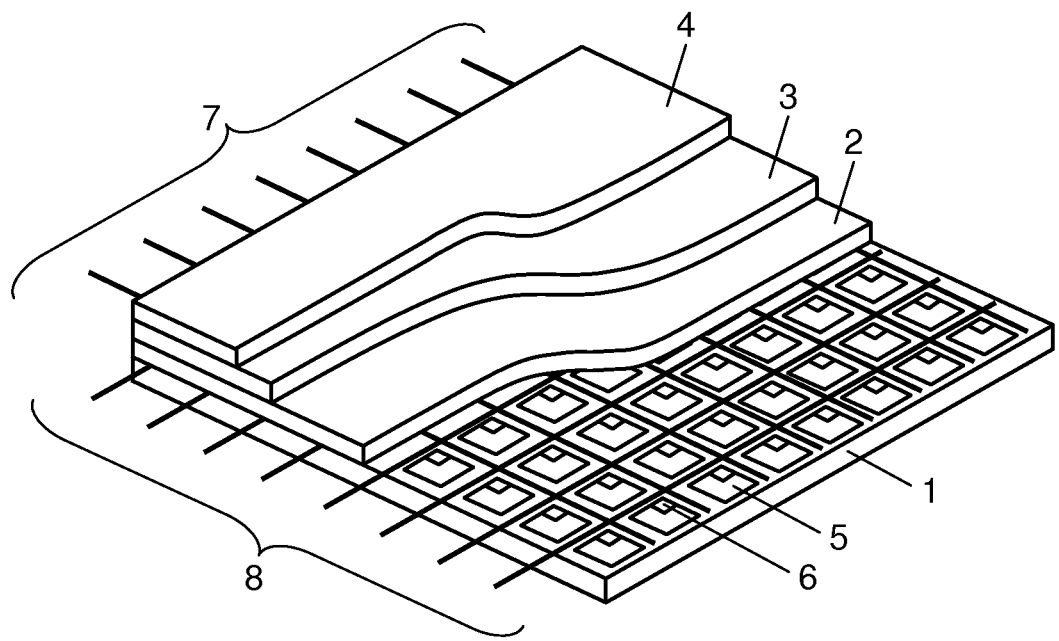
FIG. 1 is a perspective view of an EL display apparatus according to one embodiment.
Figure 2:
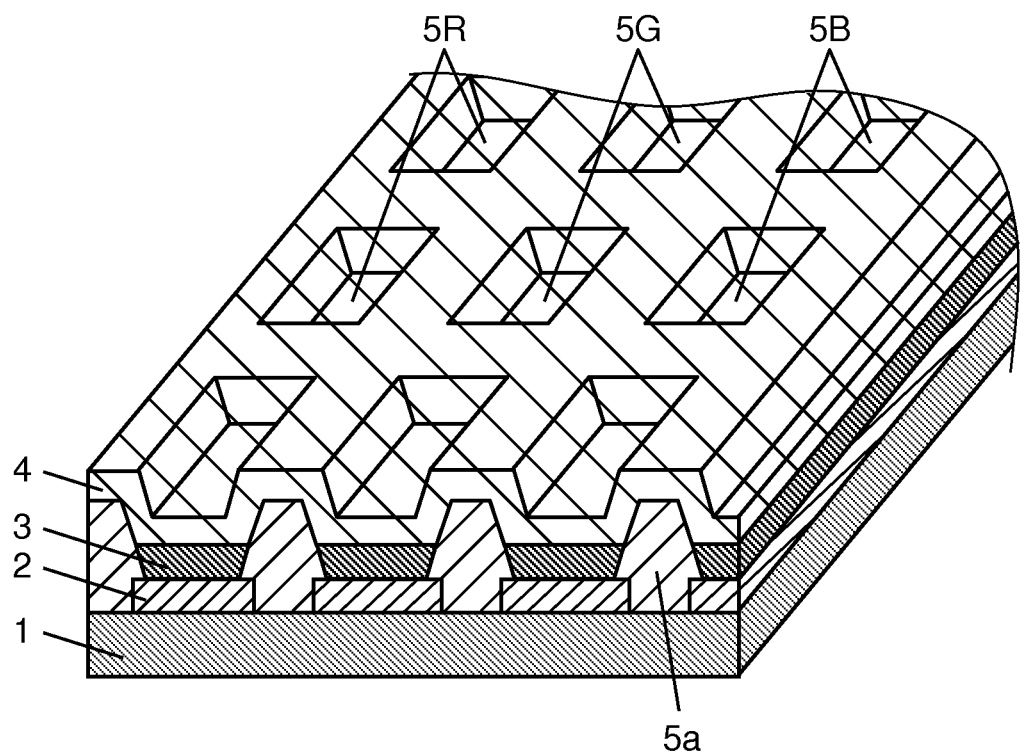
FIG. 2 is a perspective view illustrating an example of a pixel bank of the EL display apparatus according to one embodiment.
Figure 3:
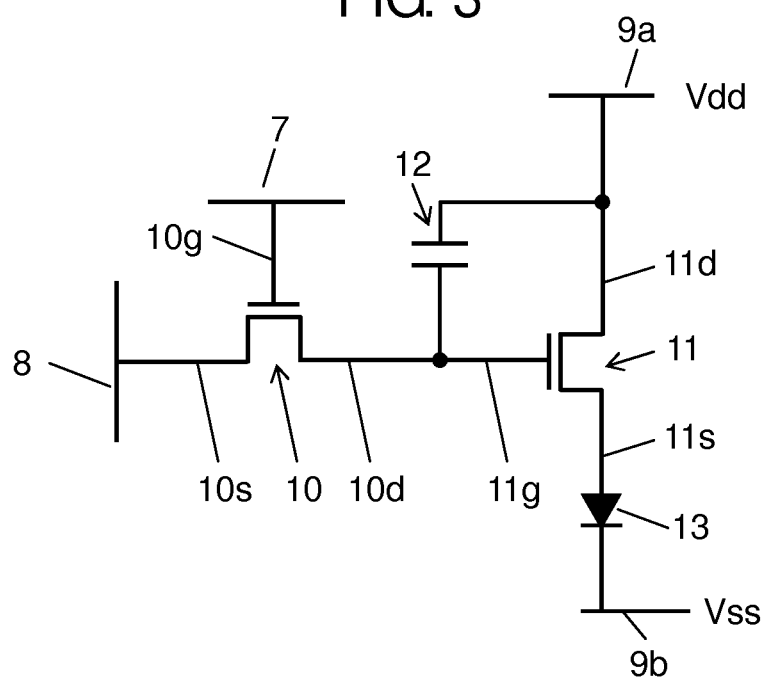
FIG. 3 is an electric circuit diagram illustrating a circuit configuration of a pixel circuit of the EL display apparatus according to one embodiment.

Hereinafter, a description will be given of a thin film transistor array device and an EL display apparatus using the same according to one embodiment with reference to FIGS. 1 to 4. As illustrated in FIGS. 1 to 3, the EL display apparatus is configured as a laminated structure including, sequentially from a bottom layer, thin film transistor array device 1 having a plurality of thin film transistors; and an EL element serving as a light-emitting portion formed of anode 2 which is a lower electrode, EL layer 3 which is a light-emitting layer formed of an organic material, and cathode 4 which is transparent and an upper electrode.

Light emission of the light-emitting portion is controlled by the thin film transistor array device.

The EL element has a structure in which EL layer 3 is disposed between a pair of electrodes of anode 2 and cathode 4, a hole transport layer is laminated between anode 2 and EL layer 3, and an electron transport layer is laminated between EL layer 3 and transparent cathode 4.

This EL display apparatus is structured of a plurality of pixels 5 which emits light of red, green, and blue and are arranged like a matrix, and each of pixels 5 is configured of the EL element and pixel circuit 6 that controls light emission of the EL element.

Further, thin film transistor array device 1 is connected to each of pixels 5, and includes a plurality of gate wiring lines 7 that are arranged in rows, source wiring lines 8 as a plurality of signal wiring lines that are arranged in columns so as to cross gate wiring lines 7, and a plurality of power wiring lines (omitted in FIG. 1) that extend in parallel to source wiring lines 8. In other words, the EL display apparatus is of an active matrix type in which display control is performed for each of pixels 5 positioned at an intersection between each of gate wiring lines 7 and each of source wiring lines 8.

As illustrated in FIG. 2, each of pixels 5 of the EL display apparatus is formed of sub-pixels 5R, 5G, and 5B representing red (R), green (G), and blue (B), respectively. A plurality of such sub-pixels 5R, 5G, and 5B are arranged like a matrix on a display surface (hereinafter, referred to as "sub-pixel row"). Sub-pixels 5R, 5G, and 5B are separated from one another by banks 5a. Banks 5a are formed such that ridges extending parallel to gate wiring lines 7 and ridges extending parallel to source wiring lines 8 cross each other. Then sub-pixels 5R, 5G, and 5B are surrounded by these ridges (i.e., they are in the opening portions of banks 5a).

Anode 2 is formed, for each of sub-pixels 5R, 5G, and 5B, on an interlayer dielectric film on thin film transistor array device 1 and inside the opening portion of bank 5a. In a similar manner, EL layer 3 is formed, for each of sub-pixels 5R, 5G, and 5B, on anode 2 and inside the opening portion of bank 5a. Transparent cathode 4 is formed continuously on the plurality of EL layers 3 and banks 5a in a manner to cover all of sub-pixels 5R, 5G, and 5B.

Further, each of pixel circuits 6 is formed for each of sub-pixels 5R, 5G, and 5B in thin transistor array device 1. Each of sub-pixels 5R, 5G, and 5B and each of pixel circuits 6 corresponding thereto are electrically connected to each other by a contact hole and a relay electrode which will be described later. Sub-pixels 5R, 5G, and 5B have an identical structure except that colors of emitted light of EL layer 3 are different. For this reason, sub-pixels 5R, 5G, and 5B are not distinguished from one another and described as pixel 5 hereinafter.

As illustrated in FIG. 3, each of pixel circuits 6 is configured of thin film transistor 10 functioning as a switching element, thin film transistor 11 functioning as a drive element, and capacitor 12 storing data to be displayed in a corresponding pixel. EL element 13 is connected in series to source electrode 11s and drain electrode 11d of thin film transistor 11.

Then gate wiring line 7 is connected, for each raw, to gate electrode 10g of thin film transistor 10 functioning as a switching element included in each of pixel circuits 6. Source wiring line 8 is connected, for each column, to source electrode 10s of thin film transistor 10. One of power wiring lines, i.e., power wiring line 9a, is connected, for each column, to drain electrode 11d of thin film transistor 11 of each of pixel circuits 6, and the other of the power wiring lines, i.e., power wiring line 9b, is connected to EL element 13.

Thin film transistor 10 is formed of gate electrode 10g connected to gate wiring line 7, source electrode 10s connected to source wiring line 8, drain electrode 10d connected to capacitor 12 and gate electrode 11g of thin film transistor 11, and a semiconductor film (not illustrated). When a voltage is applied between gate wiring line 7 and source wiring line 8 which are connected to thin film transistor 10, thin film transistor 10 stores a voltage value as a display data of the voltage applied to source wiring line 8 in capacitor 12.

Thin film transistor 11 is configured of gate electrode 11g connected to drain electrode 10d of thin film transistor 10, drain electrode 11d connected to power wiring line 9a and capacitor 12, source electrode 11s connected to anode 2, and a semiconductor film (not illustrated). Thin film transistor 11 supplies a current corresponding to the voltage value of the voltage stored in by capacitor 12 from power wiring line 9a to an anode side of EL element 13 through source electrode 11s.

This means that cathode voltage Vss is applied to a cathode terminal of EL element 13 from power wiring line 9b, and anode voltage Vdd is applied to an anode terminal of EL element 13 from power wiring line 9a through thin film transistor 11. Anode voltage Vdd and cathode voltage Vss are set in such a relation that anode voltage Vdd is larger than cathode voltage Vss.

Figure 4:
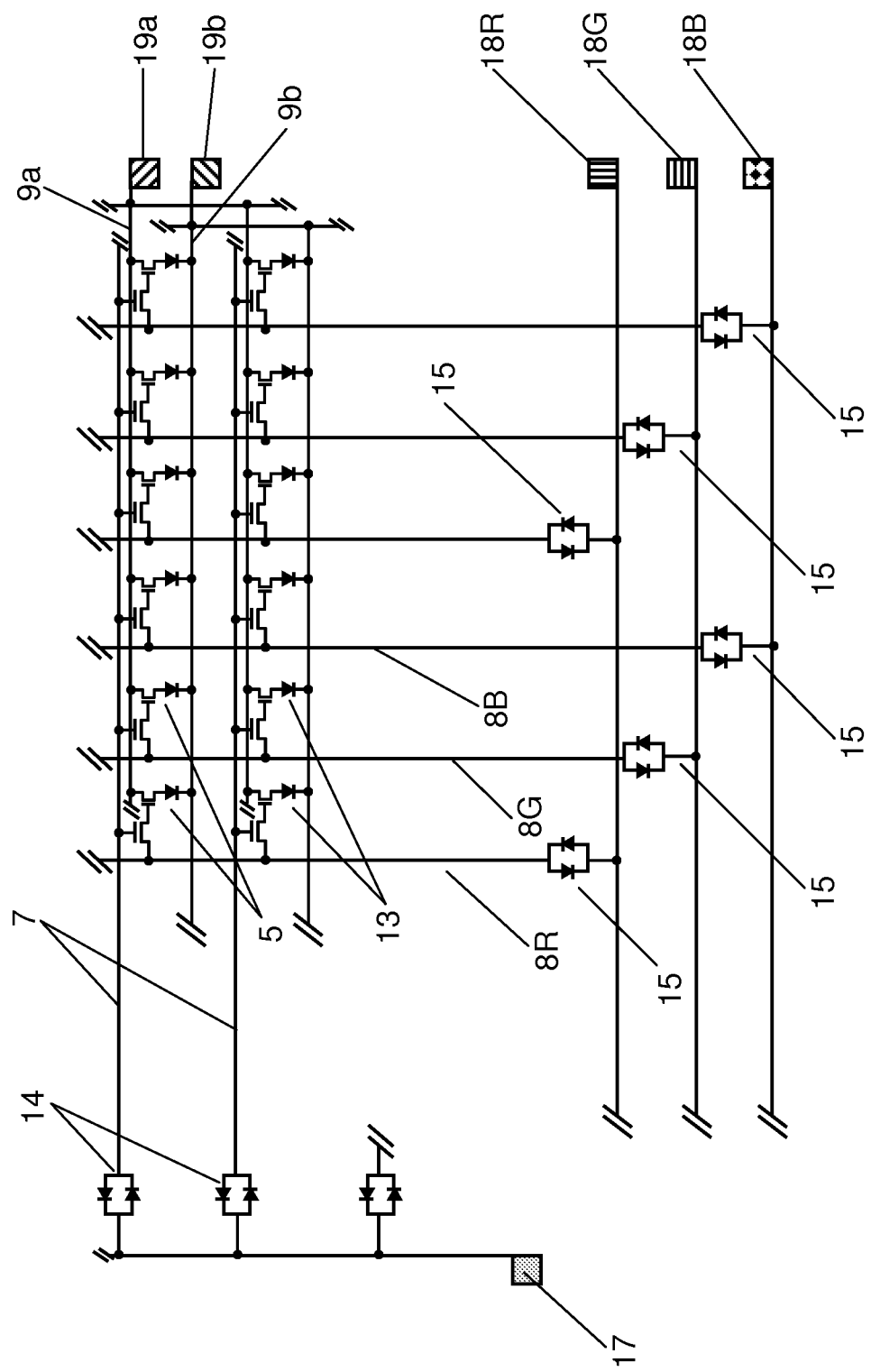
FIG. 4 is a schematic diagram illustrating wiring between a plurality of pixels and individual wiring lines of the EL display apparatus according to one embodiment.

As illustrated in FIG. 4, ESD (Electrostatic Discharge) protection element 14, as a nonlinear resistance element, is connected to each of gate wiring lines 7 each of which is connected to each of pixels 5 of R, G, and B. In addition, ESD protection element 15 is connected to each of source wiring lines 8R, 8G, and 8B of each of pixels 5 of R, G, and B.

Referring to FIG. 4, reference numeral 17 represents an electrode terminal of gate wring line 7, reference numerals 18R, 18G, and 18B respectively represent electrode terminals of source wiring lines 8R, 8G, and 8B, and reference numerals 19a and 19b respectively represent electrode terminals of power wiring lines 9a and 9b. During normal lighting, anode voltage Vdd is applied to power terminal 19a, and cathode voltage Vss is applied to power terminal 19b in such a relation that Vdd is larger than Vss. For example, in a case where anode voltage Vdd=10 V of a high-voltage side, and cathode voltage Vss=0 V of a low-voltage side are applied. When only pixel 5 of R is to be lighted, zero potential can be applied to electrode terminal 18R, and a positive potential can be applied to other electrode terminals 18G and 18B.

As a result of studying a method for inspecting a defect of a pixel during the manufacturing step of an EL display apparatus, it is found that a potential defect which will occur in the future can be detected in advance through screening for a dead dot by applying, to each of pixels 5, a reverse bias voltage where anode voltage Vdd is smaller than cathode voltage Vss.

In addition, it is also found that the number of the dead dots increases, and yet the numbers thereof are different from one another among R, G, and B by increasing a potential difference of the reverse bias voltage to be applied.

The reason for these phenomena can be this: by applying the reverse bias voltage, in a case where a foreign object is present in the pixel, an electric field is concentrated by the foreign object, leakage is caused in a portion where a film thickness is small in each of the layers that form an EL display panel. The pixels thus turn to the dead dots. On top of that, magnitudes of potential differences of the reverse bias voltages differ from each other depending on differences in the material for EL layers of R, G, B. These reverse bias voltages individually cause the dead dots for the pixels of R, G, B. As a specific example, reverse bias voltages between 10 V and 30 V are applied as cathode voltage Vss on the low-voltage side while anode voltage Vdd on the high-voltage side is set to 0 V. As a result, it is found that the following screening inspection can be done: a dead dot is caused for the pixel of G at a reverse bias voltage of about 20 V, for the pixel of B at a reverse bias voltage of about 25 V, and for the pixel of R at a reverse bias voltage of about 30 V.

According to the manufacturing method of the present disclosure, an inspection step is provided after the EL display panel is produced. The inspection step includes applying a reverse bias voltage which is a potential difference serving as a reverse bias voltage opposite to the anode voltage and the cathode voltage during lighting, and a magnitude of the reverse bias voltage is set in advance for each of the pixels of R, G, and B. The inspection step allows screening for a potential dead dot and a potential dim dot that will occur in the future, in advance after the panel is produced, thereby reducing defectives due to faulty pixels after the production, and improving yields of the EL display apparatus during the production.

As described above, according to the present disclosure, an inspection step of applying a reverse bias voltage to each of the pixels is prepared after the production of the EL display. The inspection step performs screening in advance for a potential dead dot and a potential dim dot that will occur in the future, reduces occurrences of a faulty product caused by a faulty pixel after production, and improvement of the yields of the EL display apparatus during the production.

INDUSTRIAL APPLICABILITY

The present disclosure is useful for improving the yields during the production of the EL display apparatus.

REFERENCE MARKS IN THE DRAWINGS

1 thin film transistor array device
2 anode
3 EL layer
4 cathode
5 pixel
6 pixel circuit
7 gate wiring line
8, 8R, 8B, 8G source wiring line
9a, 9b power wiring line
10, 11 thin film transistor
13 EL element

The invention claimed is:

1. A method for manufacturing an EL display apparatus, the EL display apparatus including:
   a light-emitting portion in which a light emitting layer is disposed between a pair of electrodes;
   a thin film transistor array device for controlling light emission of the light-emitting portion; and
   an EL display panel in which a plurality of pixels of colors of R, G, and B is disposed, the method comprising:
   turning a pixel which is a prospective dead dot into a dead dot in advance, after production of the EL display panel, by applying, to each of the pixels, a voltage which is preset for each of the colors R, G, and B of the pixels and has a potential difference that is a reverse bias voltage opposite to an anode voltage and a cathode voltage during lighting.

* * * * *